United States Patent
Alvarez et al.

(10) Patent No.: US 8,450,931 B2
(45) Date of Patent: May 28, 2013

(54) PROCESS FOR MINIMIZING ELECTROMIGRATION IN AN ELECTRONIC DEVICE

(75) Inventors: Khristopher Edward Alvarez, Midland, MI (US); Nick Evan Shephard, Midland, MI (US); James Steven Tonge, Sanford, MI (US)

(73) Assignee: Dow Corning Corporation, Midland, MI (US)

( * ) Notice: Subject to any disclaimer, the term of this patent is extended or adjusted under 35 U.S.C. 154(b) by 1603 days.

(21) Appl. No.: 11/883,992

(22) PCT Filed: May 9, 2006

(86) PCT No.: PCT/US2006/017718
§ 371 (c)(1),
(2), (4) Date: Aug. 8, 2007

(87) PCT Pub. No.: WO2006/122025
PCT Pub. Date: Nov. 16, 2006

(65) Prior Publication Data
US 2008/0054806 A1 Mar. 6, 2008

Related U.S. Application Data

(60) Provisional application No. 60/679,610, filed on May 10, 2005.

(51) Int. Cl.
*H01J 17/49* (2006.01)
(52) U.S. Cl.
USPC ............................................ 313/586; 445/23

(58) Field of Classification Search
USPC .................. 313/582–587; 445/23–25, 49–51
See application file for complete search history.

(56) References Cited

U.S. PATENT DOCUMENTS

| | | | |
|---|---|---|---|
| 2,708,660 A | 5/1955 | Jolly et al. | |
| 2,963,433 A | 12/1960 | Little et al. | |
| 1,057,871 A | 2/1967 | Johnson | |
| 3,649,373 A | 3/1972 | Dahms et al. | |
| 3,966,623 A | 6/1976 | Krug et al. | |
| 4,143,088 A | 3/1979 | Favre et al. | |
| 4,306,987 A | 12/1981 | Kaneko | |
| 4,377,619 A | 3/1983 | Schonhorn et al. | |

(Continued)

FOREIGN PATENT DOCUMENTS

| | | |
|---|---|---|
| EP | 0 153 493 | 10/1985 |
| EP | 0 372 405 | 12/1989 |

(Continued)

OTHER PUBLICATIONS

Krumbein, Simeon J., "Metallic Electromigration Phenomena," IEEE Transactions on Components, Hybrids, and Manufacturing Technology, Mar. 1988, p. 5-15, vol. 11, No. 1.

(Continued)

*Primary Examiner* — Joseph L Williams
(74) *Attorney, Agent, or Firm* — Erika Takeuchi

(57) ABSTRACT

A process for reducing Ag electromigration in electronic circuitry includes the step of treating the electronic circuitry with an electromigration resistant composition. This process is useful in fabricating electronic devices having electronic circuitry that is close together, such as resistors, capacitors, and displays, e.g., a plasma display panel (PDP) or a liquid crystal display (LCD).

19 Claims, 1 Drawing Sheet

U.S. PATENT DOCUMENTS

| | | | |
|---|---|---|---|
| 4,521,444 A | 6/1985 | Ponjee et al. | |
| 4,612,049 A | 9/1986 | Berner et al. | |
| 4,623,474 A | 11/1986 | Holstedt et al. | |
| 4,753,977 A | 6/1988 | Merrill | |
| 5,008,153 A | 4/1991 | Hayes | |
| 5,173,130 A | 12/1992 | Kinoshita et al. | |
| 5,476,552 A | 12/1995 | Tucker et al. | |
| 5,487,792 A | 1/1996 | King et al. | |
| 5,925,174 A | 7/1999 | Aoyama et al. | |
| 5,951,747 A | 9/1999 | Lewis et al. | |
| 6,068,711 A | 5/2000 | Lu et al. | |
| 6,083,308 A | 7/2000 | Fletcher | |
| 6,447,594 B1 | 9/2002 | Sinko et al. | |
| 6,583,201 B2 | 6/2003 | Cheng et al. | |
| 6,773,757 B1 | 8/2004 | Redline et al. | |
| 6,774,558 B2 | 8/2004 | Otani et al. | |
| 6,774,969 B2 | 8/2004 | Ma et al. | |
| 6,870,263 B1 | 3/2005 | Clevenger et al. | |
| 2002/0070112 A1 | 6/2002 | Lee et al. | |
| 2002/0195940 A1* | 12/2002 | Asano et al. | 313/586 |
| 2004/0170848 A1 | 9/2004 | Ludwig et al. | |
| 2005/0046330 A1 | 3/2005 | Okuyama et al. | |
| 2005/0062417 A1 | 3/2005 | Okuyama et al. | |

FOREIGN PATENT DOCUMENTS

| | | |
|---|---|---|
| EP | 1 510 566 A2 | 3/2005 |
| JP | 2001-144223 | 5/2001 |
| JP | 2001-325833 | 11/2001 |
| WO | WO 96/07487 | 3/1996 |
| WO | WO 96/36747 | 11/1996 |
| WO | WO 97/03131 | 1/1997 |
| WO | WO 99/60187 | 11/1999 |
| WO | WO 00/14701 | 3/2000 |
| WO | WO 00/16648 | 3/2000 |
| WO | WO 02/40419 A1 | 5/2002 |
| WO | WO 02/49979 A1 | 6/2002 |

OTHER PUBLICATIONS

Battelle, W.H. Abbott, "The Development and Performance Characteristics of Mixed Flowing Gas Test Environments," 1987, pp. 63-78.

Nakamura, Makoto, Tanaka, Hirokazu, "Evaluating the Bonding and Insulation Characteristics of Conductive Adhesives," Technical Development Headquarters, Espec Technology Report No. 18, pp. 1-14.

* cited by examiner

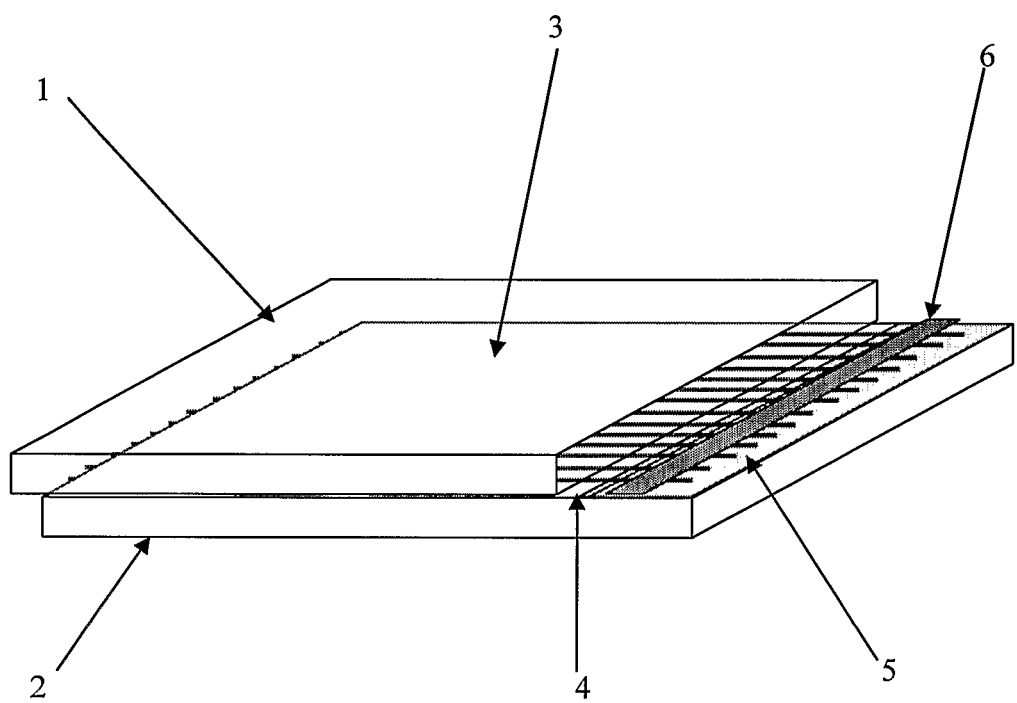

PROCESS FOR MINIMIZING ELECTROMIGRATION IN AN ELECTRONIC DEVICE

CROSS REFERENCE TO RELATED APPLICATIONS

This application is a U.S. national stage filing under 35 U.S.C. §371 of PCT Application No. PCT/US06/017718 filed on 9 May 2006, currently pending, which claims the benefit of U.S. Provisional Patent Application No. 60/679,610 filed 10 May 2005 under 35 U.S.C. §119 (e). PCT Application No. PCT/US06/017718 and U.S. Provisional Patent Application No. 60/679,610 are hereby incorporated by reference.

TECHNICAL FIELD

This invention relates to a process for minimizing electromigration of silver (Ag). More particularly, this invention relates to a process for minimizing electromigration of Ag in electronic circuitry. The process is useful during fabrication of an electronic device having electronic circuitry that is close together, such as resistors, capacitors, and displays, e.g., a plasma display panel (PDP) or a liquid crystal display (LCD).

BACKGROUND

Under the influence of an applied electrical field, temperature, and humidity, Ag (either in a metallic form, or as an alloy such as CuAg, AgPd, or SnAg) may be converted to $Ag^+$ ions, migrate, and re-deposit to form a new Ag metallic area. In an electronic device, this new Ag metallic area often takes the form of dendrites or "whiskers", which short circuit conducting Ag traces. Electromigration requires four conditions: a mobile metal; a voltage gradient; humidity or a continuous film of water; and soluble ions. Ag migration is a problem because Ag is anodically soluble and requires low activation energy to initiate the electromigration process.

Two trends in the electronic industry are making electromigration of Ag an even more severe problem: one is the reduction in lead (Pb) in solder; the second is the continual miniaturization of circuitry. The Pb replacement solders contain increasing amounts of Ag metal, hence the greater opportunity for Ag migration. The reduction in circuitry dimensions means smaller separation between circuit elements resulting in higher electrical field gradients (Volts/m) driving the electromigration under both AC and DC conditions and increasing the potential for short circuits.

It is known that a soluble ionic species is essential to provide the ionically conducting pathway for the Ag migration to occur, and the nature of the ionic contaminants has a major impact on the severity of Ag migration. High ionic mobility is influenced by such factors as ionic radius, electronegativity, electron affinity, and charge to size. The source of these ions is varied, but can usually be traced to the substrate, or residues of the circuitry fabrication process. High polarity and hydrophilic substrates such as glass and some epoxy substrates are particularly susceptible to Ag migration especially when exposed to high humidity and temperature.

SUMMARY

This invention relates to a process for reducing electromigration in electronic circuitry. The process comprises treating the electronic circuitry with an electromigration resistant composition. This invention further relates to a PDP made using this process.

DETAILED DESCRIPTION

All amounts, ratios, and percentages are by weight unless otherwise indicated. The following is a list of definitions as used herein.

DEFINITIONS

"A" and "an" each mean one or more.

"Corrosion" means a process by which a metal oxidizes or becomes alloyed in the presence or absence of an applied electrical field.

"Electromigration" means the transport of a metal on a nonmetallic medium under the influence of an applied electrical field.

Process

This invention relates to a process comprising:
1) forming electronic circuitry on a substrate,
2) treating all or a portion of the electronic circuitry with an electromigration resistant composition, and
optionally 3) coating the product of step 2).

The electronic circuitry may comprise Ag electrodes, such as address electrodes, display electrodes, and scanning electrodes useful in a PDP. The electrodes may be bare or coated. The electronic circuitry may be formed by any conventional means.

The substrate used in this process is not specifically restricted. The substrate selected will depend on the various factors including the use of the process described above, e.g., the type of electronic device to be fabricated. The substrate can be any material used in the fabrication of an electronic device. The substrate can be, for example a ceramic substrate, a flexible substrate, or a rigid substrate commonly used in electronic device packaging. Examples of suitable substrates include glass, a ceramic, a metal, a metal-coated surface, a polymer, and combinations thereof.

Metals and metal coatings include aluminum, chromium, copper, gold, lead, nickel, platinum, solder, stainless steel, tin, titanium, alloys thereof, and combinations thereof.

Ceramics include aluminum nitride, aluminum oxide, silicon carbide, silicon oxide, silicon oxynitride, and combinations thereof.

Polymers include benzocyclobutene, bismaleimide, cyanate, epoxy, polybenzoxazole, polycarbonate, polyimide, polymethylmethacrylate, polyphenylene ether, polyvinylidene chloride, and combinations thereof.

Without wishing to be bound by theory it is thought that treating in step 2) provides an interface between the electronic circuitry and subsequent coatings that may be applied in step 3). The electronic circuitry may be treated by any conventional means such as dipping, spraying, flow coating, roll coating, wiping, or spin coating.

In optional step 3), the treated electronic circuitry from step 2) may be coated with, for example, an encapsulant, a conductive film, a conductive adhesive, or a combination thereof. The encapsulant may be thermally cured, radiation cured, or aerobically cured (e.g., moisture cured). The encapsulant may be an epoxy, silicone, urethane, or acrylic. The conductive film may be an anisotropically conductive film (ACF). The adhesive may be an anisotropically conductive adhesive (ACA). The electromigration resistant composition should not detrimentally affect performance of such encapsulant, ACF, or ACA.

Electromigration Resistant Composition

The electromigration resistant composition comprises:
A) an electromigration resistant agent,
B) an organosilane, optionally C) a catalyst, and
optionally D) a carrier.

The amount of component A) will depend on the choice of electromigration resistant agent or agents selected for component A), the choice of organosilane or organosilanes for component B), the choice of catalyst or catalysts, if any, for component C), and the choice of carrier or carriers, if any, for component D). However, the amount of component A) in the electromigration resistant composition may range from 1% to 50% based on the combined weights of components A), B), and C). Alternatively, the composition may contain 0.01% to 50%, alternatively 0.01% to 5%, and alternatively 0.01% to 0.5%, based on the total weight of the composition.

Component A) may comprise a heterocyclic aromatic compound. The heterocyclic aromatic compound may comprise a nitrogen atom or a sulfur atom in a ring. The heterocyclic aromatic compounds containing a nitrogen atom in a ring may have a substituted or unsubstituted five-membered ring. The ring may be substituted with mercapto, amino, or carboxyl groups.

Component A) may comprise an aliphatic or cycloaliphatic mono- or poly-carboxylic acid substituted in its aliphatic or cycloaliphatic group by at least one group of formula:

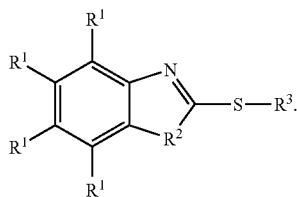

In the formula above, $R^3$ is an aliphatic or cycloaliphatic mono- or poly-carboxylic acid containing compound, $R^2$ is carbon, oxygen, sulfur, or NH and each $R^1$ is independently a hydrogen atom, alkyl group, halogenated alkyl group, alkoxy group, alkylthio group, alkylsulfonyl group, cycloalkyl group, phenyl group, alkylphenyl group, phenylalkyl group, halogen atom, —CN, —NO$_2$, —COOH, —COO-alkyl, —OH, primary amino, secondary amino, tertiary amino, or carbamoyl group. Examples of suitable aliphatic or cycloaliphatic mono- or poly-carboxylic acids of the formula above include, but are not limited to, those compounds listed in U.S. Pat. No. 4,612,049 at col. 4, line 20 to col. 10, line 34, which is hereby incorporated by reference.

Component A) may comprise a thiourea derivative. The thiourea derivative may have a formula selected from:

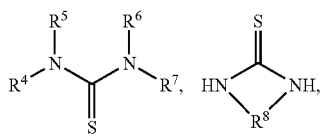

and combinations thereof.
In the formula above, each $R^4$, $R^5$, and $R^6$ are independently selected from a hydrogen atom, an alkyl group of 1 to 6 carbon atoms, acetyl, and alkenyl. $R^7$ is hydrogen, an alkyl group of 1 to 6 carbon atoms, acetyl, alkenyl, or —NH$_2$. $R^8$ is a divalent hydrocarbon group of at least two carbon atoms such as ethylene, n-propylene, or isopropylene. Examples of thiourea derivatives are disclosed in U.S. Patent Publication 2004/0170848 A1.

Component A) may comprise a benzothiazole derivative. The benzothiazole derivative may have a formula selected from:

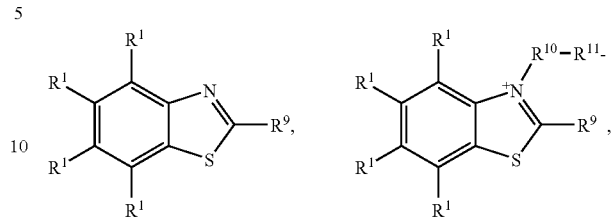

or a combination thereof.
In the formulae above, $R^1$ is as described above. $R^9$ is a hydrogen atom, an alkyl group of 1 to 6 carbon atoms, —SH, —SCH$_2$CH$_2$CH$_2$SO$_3$Na, —NH$_2$, —NHCH$_3$, or —N(CH$_3$)$_2$. $R^{10}$ is an alkyl group of 1 to 6 carbon atoms, alkenyl, or carboxyalkyl. $R^{11}$ is an anion comprising a halogen atom or sulfate. Examples of benzothiazole derivates are disclosed in U.S. Patent Publication 2004/0170848 A1.

Component A) may comprise a dialkyldithiocarbamic acid. The dialkyldithiocarbamic acid may have the formula:

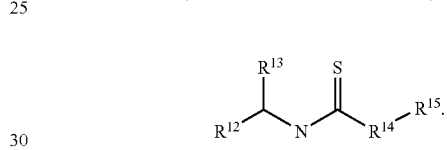

In the formula above, $R^{12}$ and $R^{13}$ are independently a hydrogen atom, an alkyl group of 1 to 6 carbon atoms, $R^{14}$ is —S— or —SCH$_2$CH$_2$CH$_2$SO$_3$—, and $R^{15}$ is a hydrogen atom, ammonium, sodium, or potassium. Examples of dialkyldithiocarbamic acids are disclosed in U.S. Patent Publication 2004/0170848 A1. Examples of suitable thio compounds are disclosed in U.S. Patent Publication 2004/0170848 A1, paragraphs [0016] to [0029], which paragraphs are hereby incorporated by reference.

Component A) may comprise an o-alkylxanthic acid derivative. The o-alkylxanthic acid derivative may have the formula:

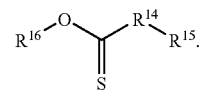

In the formula above, $R^{14}$ and $R^{15}$ are as described above and $R^{16}$ is an alkyl group of 1 to 6 carbon atoms.

Component A) may comprise a heterocyclic compound of the formula:

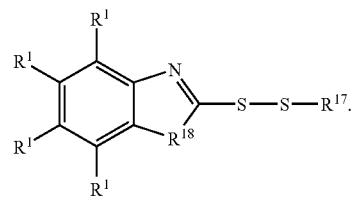

In the formula above, $R^1$ is as described above. $R^{17}$ is an alkyl group of 1 to 30 carbon atoms. $R^{18}$ is a carbon atom, an oxygen atom, or a sulfur atom. Examples of such heterocyclic compounds and methods for their preparation are disclosed in U.S. Pat. No. 2,963,433.

Component A) may comprise an amine salt derivative of a mercaptobenzothiazole. Said amine salt derivative may have the formula:

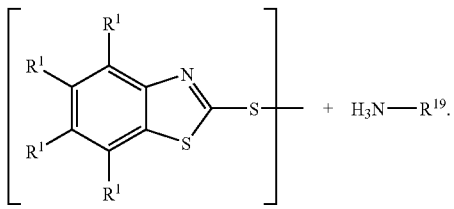

In the above formula, $R^{19}$ is an alkyl or alkenyl group of 4 to 30 carbon atoms. Examples of amine salt derivatives of mercaptobenzothiazoles are disclosed in U.S. Pat. No. 3,966,623.

Component A) may comprise a 2,5-bis-hydrocarbyldithio-1,3,4-thiadiazole. The 2,5-bis-hydrocarbyldithio-1,3,4-thiadiazole may have the formula:

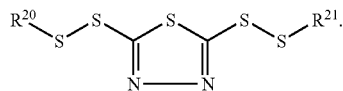

In the formula above, $R^{20}$ and $R^{21}$ are each independently alkyl groups of 4 to 30 carbon atoms or alkenyl groups of 4 to 30 carbon atoms. Examples of 2,5-bis-hydrocarbyldithio-1, 3,4-thiadiazoles are disclosed in U.S. Pat. No. 3,966,623.

Component A) may comprise a mercaptothiazol. The mercaptothiazol may have the formula:

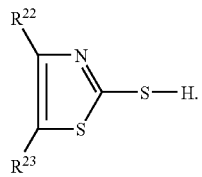

In the formula above, $R^{22}$ and $R^{23}$ are each independently selected from a hydrogen atom and an alkyl group. Examples of mercaptothiazols are disclosed in U.S. Pat. No. 2,708,660. Component A) may comprise an imidazoline. The imidazoline may have the formula:

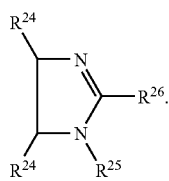

In the formula above, each $R^{24}$ is independently a hydrogen atom or an alkyl group, $R^{25}$ is group having a molecular weight less than 75, and $R^{26}$ is a hydrocarbon group of 8 to 20 carbon atoms. Examples of imidazolines are disclosed in U.S. Pat. No. 2,708,660.

Examples of suitable heterocyclic aromatic compounds suitable for use as component A) are exemplified by, but not limited to: acridine, 2-amino-thiazole, 2-amino-thiazoline, 2-amino-1,2-4 triazole, anionine, benzimidazole, (2-benzimidazolylthio)succinic acid, benzoxazole (and derivatives thereof), benzothiazole (and derivatives thereof), benzimidazole (and derivatives thereof), benzotriazole (BTA), 3-benzylamino-1-butyne, decamethylene imide, diaminoheptane, dicyandiamine, N,N-di-(2-ethylhexyl)-4-methyl-1H-benzotriazole-1-methanamine, 2,5-dimercapto-1,3,4 thiadiazole, dipropargyl ether, dipropargyl thioether, 6-N-ethyl purine, 1-ethylamino-2-quinoline (and derivatives thereof), hexamethylene-3,5-dinitrobenzene, hexamethylene imide, hexamethylene iminebenzoate, hexamethylene tetramine, imidazole (and derivatives thereof), 3-isopropylamino-1-butyne, mercaptan, mercaptobenzothiazole (MBT), 2-mercaptothiazoline, d-oximino-b-vinyl quincuclidine, 1,10-phenathiodine, phenanthroline, phenothiazine, propargyl quinolinium bromide, propargyl caproate, (2-thio-2'-benzo-thiazolyl) butaonedioic acid, thiophenol (and derivatives thereof), toluidine, and combinations thereof.

Examples of compounds that may be used as component A) are disclosed in U.S. Pat. Nos. 2,963,433; 3,966,623; 4,612,049; 5,008,153; 5,173,130; 6,583,201 and U.S. Patent Application Publication 2004/0170848. Compounds suitable for use as component A) are known in the art and are commercially available. Examples include compounds supplied by CIBA® Speciality Chemicals as IRGAMET® 30 or IRGAMET® 39; R. T. Vanderbilt as CUVAN® 826 and CUVAN® 484; and Rhein Chemie Group as Additin® 8210, 8213, 8221, 8239 series. One skilled in the art would recognize that a single compound described above or a combination comprising two or more of the above compounds that differ in structure may be used as component A).

Component B) Organosilane

Component B) is an organosilane. The amount of organosilane added to the electromigration resistant composition may be 50% to 90% based on the combined weights of components A), B), and C). The organosilane may be, for example, an alkoxysilane, an amino alkyl silane, an epoxy alkyl silane, a mercapto alkyl silane, or a combination thereof. Examples of alkoxysilanes include 2-methoxy-1-methylethylorthosilicate, tetraethyl orthosilicate, tetrapropyl orthosilicate, and a combination thereof. Examples of amino alkyl silanes include gamma-aminopropyltriethoxysilane, aminopropyltrimethoxysilane, N-beta(aminoethyl)-gamma-aminopropyltrimethoxysilane. Examples of mercapto alkyl silanes include, but are not limited to, gamma-mercaptopropyltrimethoxysilane. Examples of organosilanes suitable for use as component B) are disclosed in U.S. Pat. No. 5,008,153 and the references cited therein. Alternatively, the electromigration resistant composition may comprise a reaction product of components A) and B) in addition to, or instead of, all or a portion of components A) and B).

Component C) Catalyst

Optional component C) is a catalyst that may be added to the electromigration resistant composition to facilitate condensation reaction. The catalyst may comprise a Lewis acid; a primary, secondary, or tertiary organic amine; a metal oxide; a titanium compound; a tin compound; a zirconium compound; or a combination thereof. Suitable catalysts are known in the art and are exemplified by the catalysts described in U.S. Pat. No. 4,753,977 at col. 4, line 35 to col. 5, line 57. The amount of component C) depends on various factors including the type of catalyst selected and the choice of the remaining components in the electromigration resistant composition, however the amount of component C) may be 0% to 50% based on the combined weights of components A), B) and C).

Component C) may comprise a titanium catalyst. Suitable titanium catalysts include organofunctional titanates, siloxytitanates, and combinations thereof. Organofunctional titanates are exemplified by 1,3-propanedioxytitanium bis(ethylacetoacetate); 1,3-propanedioxytitanium bis (acetylacetonate); diisopropoxytitanium bis (acetylacetonate); 2,3-di-isopropoxy-bis(ethylacetate) titanium; titanium naphthenate; tetrapropyltitanate; tetrabutyltitanate; tetraethylhexyltitanate; tetraphenyltitanate; tetraoctadecyltitanate; tetrabutoxytitanium; tetraisopropoxytitanium; ethyltriethanolaminetitanate; a betadicarbonyltitanium compound such as bis(acetylacetonyl) diisopropyltitanate; or a combination thereof. Other organofunctional titanates are exemplified by those in U.S. Pat. No. 4,143,088 at col. 7, line 15 to col. 10, line 35. Siloxytitanates are exemplified by tetrakis(trimethylsiloxy) titanium, bis(trimethylsiloxy)bis(isopropoxy)titanium, or a combination thereof.

The catalyst may comprise a tin compound. Suitable tin compounds are exemplified by dibutyltindilaurate; dibutyltindiacetate; dibutyltindimethoxide; carbomethoxyphenyl tin tris-uberate; tin octoate; isobutyl tin triceroate; dimethyl tin dibutyrate; dimethyl tin di-neodeconoate; triethyl tin tartrate; dibutyl tin dibenzoate; tin oleate; tin naphthenate; butylintri-2-ethylhexoate; tin butyrate; or a combination thereof.

The catalyst may comprise a zirconium compound. Suitable zirconium compounds are exemplified by zirconium octoate.

Component D) Carrier

Optional component D) is a carrier that may be added to the electromigration resistant composition for ease of preparation or application of the electromigration resistant composition. The amount of carrier added to the electromigration resistant composition may be 0% to 99% based on the weight of the electromigration resistant composition. The carrier may be a liquid capable of wetting the substrate in step 1) and the electronic circuitry in step 2) of the process described above. Suitable carriers are exemplified by polar solvents such as water, alcohol, or a combination thereof. Examples of suitable alcohols include ethanol, methanol, isopropanol, butanol, and glycol ether such as propylene glycol monobutyl ether. Alternatively, the carrier may comprise a hydrocarbon such as naphtha. Alternatively, the carrier may comprise a silicone oil. Examples of carriers suitable for use as component D) are disclosed in U.S. Pat. No. 5,008,153.

The electromigration resistant composition of this invention may be prepared by any conventional means, such as mixing all components at ambient temperature.

The electromigration resistant composition of this invention is free of the film-formers disclosed in U.S. Patent Application Publication 2004/01708848 and U.S. Pat. No. 4,612, 049. 'Free of film-formers' means that the electromigration resistant composition contains no film-formers or an amount of film-formers that does not interfere with the intended use of the electronic circuitry, e.g., when the electromigration resistant composition is between Ag traces and an encapsulant, ACA, or ACF.

EXAMPLES

These examples are intended to illustrate the invention to one of ordinary skill in the art and should not be interpreted to limit the scope of the invention set forth in the claims.

Reference Example 1

Use of the Electromigration Resistant Composition in a PDP

FIG. 1 is a portion of a PDP made using the process described above. The PDP includes a front sheet of glass (1) and a back sheet of glass (2). Ag electrodes (3) are applied to one or both sheets of glass (1), (2). The body of the PDP contains a dielectric layer (4) covering a portion of the Ag electrodes (3). The edges of the Ag electrodes (3) are kept bare to enable electrical contact between the Ag electrodes (3) and the flexible circuit tape (not shown). The flexible circuit tape is attached to the Ag electrodes (3) by the ACF (6). Application of the electromigration resistant composition to form an electromigration resistant layer (5) between the tips of the Ag electrodes (3) and the ACF (6) can reduce the occurrence of electromigration.

Reference Example 2

Test Method

Water drop testing involves applying a drop of de-ionized water to the gap between electrodes at relatively low voltages; 2 volts was used in these examples. The electrode patterns are those used in SIR (surface insulations resistance). The water drop can be viewed under an optical microscope, and the time it takes for a short to form between the conductors is measured by the increase in current. A current limit is set to avoid damaging the power supply. This test is described in Mercado, L. L., White, J., Sarihan, V.& Lee, T. T. "Failure mechanism study of ACF packages." IEEE Trans. Comp. Hybrids & Man. Tech. 2003, 26(3) 509.

In these examples, each composition was coated on a circuit board (P-IPC-B-25-1 from Diversified Systems of Indianapolis, Ind., U.S.A.) having a 6.25 mil gap between Ag electrodes. A 3 microliter drop of de-ionized water purified via ion exchange was used, at room temperature with a 2 volts DC bias for a maximum of 1000 seconds. The drop can be limited to a 2.54 mm square area by solder mask. The intent of the experiment was to induce the ionic impurities on the surface to increase the strength of the electrolyte and promote silver migration. Time for the current to reach 1 Amp was recorded.

Comparative Examples 1 and 2 and Examples 3-13

Samples of electromigration resistant compositions are prepared by mixing the ingredients in Table 1. The Primer contained (C) 5 parts tetrabutoxy titanate, (B) 5 parts 2-methyoxy-1-methylethylorthosilicate, (B) 5 parts tetrapropyl orthosilicate, and 85 parts octamethyltrisiloxane. MBT was mercaptobenzothiazole. IRGAMET® 39 was N,N-bis(2-ethylhexyl)-ar-methyl-1H-benzotriazole-1-methanamine purchased from CIBA® Specialty Chemicals. BTA was benzotriazole. CUVAN® 484 was an alkylthiadiazole commercially available from R.T. Vanderbilt Company of Norwalk, Conn., U.S.A. CUVAN® 826 was a 2,5-cimercapto-1,3,4-thiadiazole derivative also available from R.T. Vanderbilt Company. 6-HQ was 6-hydroxyquinone. IRGAMET® 30 was a triazole derivative also from CIBA® Specialty Chemicals. 2-MB was 2-mercaptobenzimidazole. COBRATEC® CBT was carboxybenzotriazole from PMC Specialties Group, Inc. of Cincinnati, Ohio, U.S.A. ERA meant electromigration resistant agent.

The electromigration resistant compositions of examples 3-13 were each coated on a circuit board. For comparison, an uncoated circuit board (Ex. 1) and a circuit board coated with a primer without an electromigration resistant agent (Ex. 2) were tested according to the method in reference example 2. The results are in Table 1. The results show that each electromigration resistant agent tested lengthened the time before failure (current reaching 1 Amp). One skilled in the art would be able to optimize the amount of electromigration resistant agent without undue experimentation.

TABLE 1

| Example No. | ERA | Weight % of ERA in the total composition | Time to reach 1 Amp (sec) |
| --- | --- | --- | --- |
| Comparative 1 | None | 0 | 90 |
| Comparative 2 | None | 0 | 530 |
| 3 | MBT | 1% | 700 |
| 4 | IRGAMET ® 39 | 0.5% | >1000 |
| 5 | BTA | 0.5% | >1000 |
| 6 | CUVAN ® 484 | 0.5% | 530 |
| 7 | CUVAN ® 484 | 1% | >1000 |
| 8 | CUVAN ® 826 | 0.5% | 630 |
| 9 | CUVAN ® 826 | 1% | >1000 |
| 10 | 6-HQ | 0.5% | 850 |
| 11 | 2-MB | 0.5% | >1000 |
| 12 | COBRATEC ® CBT | 0.5% | 630 |
| 13 | Vanlube 601 | 0.5% | 710 |

INDUSTRIAL APPLICABILITY

The process and electromigration resistant composition of this invention reduces electromigration of Ag in electronic devices, thereby reducing failures of the devices due to short circuits. Without wishing to be bound by theory, it is thought that the process and electromigration resistant composition of this invention may also reduce corrosion. The process of this invention is useful during fabrication of an electronic device having electronic circuitry that is close together, such as resistors, capacitors, and displays, e.g., a PDP or LCD. The process of this invention may be used during fabrication of PDP devices such as those disclosed in U.S. Patent Application Publication 2005/0062417A1 to minimize electromigration of Ag that can cause short circuits in, for example, a plasma display television.

DRAWING

FIG. 1 is a portion of a plasma display panel (PDP).

REFERENCE NUMERALS 1. front glass
2. back glass
3. silver electrodes
4. dielectric layer
5. anti migration layer
6. ACF, asymmetrically conductive adhesive

The invention claimed is:

1. A process for minimizing electromigration of Ag in electronic circuitry comprising:
   1) forming the electronic circuitry on a substrate,
   2) treating all or a portion of the electronic circuitry with an electromigration resistant composition, where the electromigration resistant composition comprises
      A) an electromigration resistant agent,
      B) an organosilane,
      optionally C) a catalyst, and
      D) a carrier, and
   optionally 3) coating the product of step 2).

2. The process of claim 1, where step 3) is present and the product of step 2) is coated with a coating selected from an encapsulant, a conductive film, a conductive adhesive, or a combination thereof.

3. A process for fabricating a plasma display panel comprising:
   1) forming Ag electrodes on a glass panel,
   2) treating the Ag electrodes with an electromigration resistant composition where the electromigration resistant composition comprises
      A) an electromigration resistant agent,
      B) an organosilane,
      optionally C) a catalyst, and
      D) a carrier selected from the group consisting of a hydrocarbon, silicone oil, or a combination thereof, and
   3) coating the product of step 2).

4. The process of claim 3, where component A) is selected from acridine, 2-amino-thiazole, 2-amino-thiazoline, 2-amino-1,2-4 triazole, anionine, benzimidazole, (2-benzimidazolylthio)succinic acid, benzoxazole (and derivatives thereof), benzothiazole (and derivatives thereof), benzimidazole (and derivatives thereof), benzotriazole, 3-benzylamino-1-butyne, decamethylene imide, diaminoheptane, dicyandiamine, N,N-di-(2-ethylhexyl)-4-methyl-1H-benzotriazole-1-methanamine, 2,5-dimercapto-1,3,4 thiadiazole, dipropargyl ether, dipropargyl thioether, 6-N-ethyl purine, 1-ethylamino-2-quinoline (and derivatives thereof), hexamethylene-3,5-dinitrobenzene, hexamethylene imide, hexamethylene iminebenzoate, hexamethylene tetramine, imidazole (and derivatives thereof), 3-isopropylamino-1-butyne, mercaptan, mercaptobenzothiazole, 2-mercaptothiazoline, d-oximino-b-vinyl quincuclidine, 1,10-phenathiodine, phenanthroline, phenothiazine, propargyl quinolinium bromide, propargyl caproate, (2-thio-2'-benzo-thiazolyl)butanedioic acid, thiophenol (and derivatives thereof), toluidine, or a combination thereof.

5. The process of claim 3, where component A) is selected from:
   I) an aliphatic or cycloaliphatic mono- or poly-carboxylic acid substituted in its aliphatic or cycloaliphatic group by at least one group of formula:

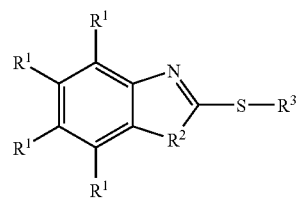

where $R^3$ is an aliphatic or cycloaliphatic mono- or poly-carboxylic acid containing compound, $R^2$ is a carbon atom, an oxygen atom, a sulfur atom, or NH and each $R^1$ is independently a hydrogen atom, alkyl group, halogenated alkyl group, alkoxy group, alkylthio group, alkylsulfonyl group, cycloalkyl group, phenyl group, alkylphenyl group, phenylalkyl group, halogen atom, —CN, —NO$_2$, —COOH, —COO-alkyl, —OH, primary amino, secondary amino, tertiary amino, or carbamoyl group;

II) a thiourea derivative having a formula selected from:

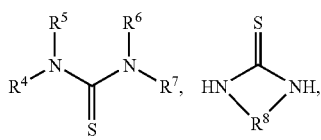

or combinations thereof, where each $R^4$, $R^5$, and $R^6$ are independently selected from a hydrogen atom, an alkyl group of 1 to 6 carbon atoms, acetyl, and alkenyl; $R^7$ is hydrogen, an alkyl group of 1 to 6 carbon atoms, acetyl, alkenyl, or —$NH_2$; and $R^8$ is a divalent hydrocarbon group of at least two carbon atoms;

III) a benzothiazole derivative having a formula selected from:

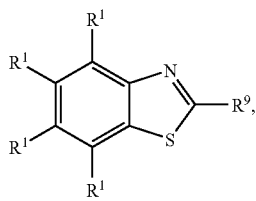

or a combination thereof, where $R^1$ is as described above; $R^9$ is a hydrogen atom, an alkyl group of 1 to 6 carbon atoms, —SH, —$SCH_2CH_2CH_2SO_3Na$, —$NH_2$, —$NHCH_3$, or —$N(CH_3)_2$; $R^{10}$ is an alkyl group of 1 to 6 carbon atoms, alkenyl, or carboxyalkyl; $R^{11}$ is an anion comprising a halogen atom or sulfate;

IV) a dialkyldithiocarbamic acid having formula:

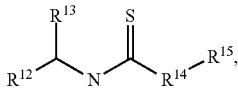

where $R^{12}$ and $R^{13}$ are independently a hydrogen atom, an alkyl group of 1 to 6 carbon atoms; $R^{14}$ is —S— or —$SCH_2CH_2CH_2SO_3$—; and $R^{15}$ is a hydrogen atom, ammonium, sodium, or potassium;

V) an o-alkylxanthic acid derivative having formula:

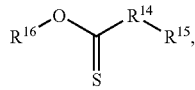

where $R^{14}$ and $R^{15}$ are as described above and $R^{16}$ is an alkyl group of 1 to 6 carbon atoms;

VI) a heterocyclic compound having formula:

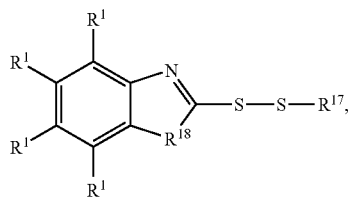

where $R^1$ is as described above; $R^{17}$ is an alkyl group of 1 to 30 carbon atoms; and $R^{18}$ is a carbon atom, an oxygen atom, or a sulfur atom;

VII) an amine salt derivative of a mercaptobenzothiazole having formula:

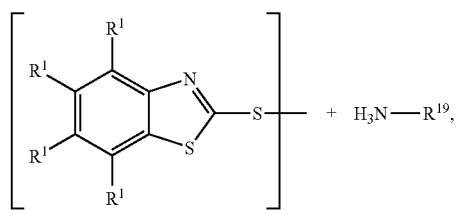

where $R^{19}$ is an alkyl or alkenyl group of 4 to 30 carbon atoms;

VIII) a 2,5-bis-hydrocarbyldithio-1,3,4-thiadiazole having formula:

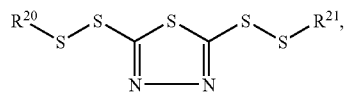

where $R^{20}$ and $R^{21}$ are each independently alkyl groups of 4 to 30 carbon atoms or alkenyl groups of 4 to 30 carbon atoms;

IX) a mercaptothiazol having formula:

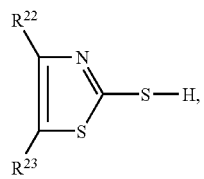

where $R^{22}$ and $R^{23}$ are each independently selected from a hydrogen atom and an alkyl group; and X) an imidazoline having formula:

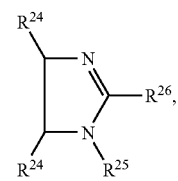

where each $R^{24}$ is independently a hydrogen atom or an alkyl group, $R^{25}$ is group having a molecular weight less than 75, and $R^{26}$ is a hydrocarbon group of 8 to 20 carbon atoms.

6. The process of claim 3, where component B) comprises an alkoxysilane, an amino alkyl silane, an epoxy alkyl silane, a mercapto alkyl silane, or a combination thereof.

7. The process of claim 3, where component C) is present and comprises a catalyst selected from a Lewis acid; a primary, secondary, or tertiary organic amine; a metal oxide; a titanium compound; a tin compound; a zirconium compound; or a combination thereof.

8. A plasma display panel prepared by the process of claim 3.

9. A plasma display panel comprising:
(i) a front sheet of glass,
(ii) a back sheet of glass opposite the front sheet of glass,
(iii) an Ag electrode applied to at least one of the front sheet of glass and the back sheet of glass, where the Ag electrode has a bare edge portion and a covered portion, (iv) a dielectric layer, where the dielectric layer covers the covered portion of the Ag electrode, and (v) an electromigration resistant composition applied over the edge portion of the Ag electrode, where the electromigration resistant composition comprises A) an electromigration resistant agent, B) an organosilane, optionally C) a catalyst, and D) a carrier selected from the group consisting of a hydrocarbon, silicone oil, or a combination thereof.

10. The plasma display panel of claim 9, further comprising an anisotropically conductive film over the Ag electrode.

11. The plasma display panel of claim 9, where component A) is selected from:

I) an aliphatic or cycloaliphatic mono- or poly-carboxylic acid substituted in its aliphatic or cycloaliphatic group by at least one group of formula:

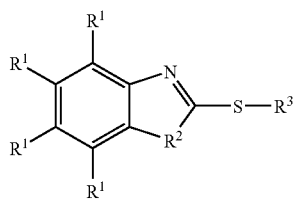

where $R^3$ is an aliphatic or cycloaliphatic mono- or polycarboxylic acid containing compound, $R^2$ is a carbon atom, an oxygen atom, a sulfur atom, or NH and each $R^1$ is independently a hydrogen atom, alkyl group, halogenated alkyl group, alkoxy group, alkylthio group, alkylsulfonyl group, cycloalkyl group, phenyl group, alkylphenyl group, phenylalkyl group, halogen atom, —CN, —NO$_2$, —COOH, —COO-alkyl, —OH, primary amino, secondary amino, tertiary amino, or carbamoyl group;

II) a thiourea derivative having a formula selected from:

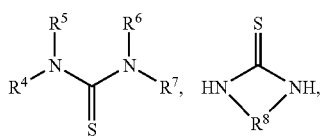

or combinations thereof, where each $R^4$, $R^5$, and $R^6$ are independently selected from a hydrogen atom, an alkyl group of 1 to 6 carbon atoms, acetyl, and alkenyl; $R^7$ is hydrogen, an alkyl group of 1 to 6 carbon atoms, acetyl, alkenyl, or —NH$_2$; and $R^8$ is a divalent hydrocarbon group of at least two carbon atoms;

III) a benzothiazole derivative having a formula selected from:

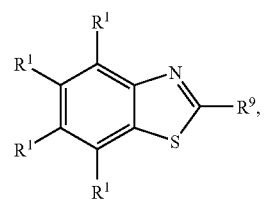

or a combination thereof, where $R^1$ is as described above; $R^9$ is a hydrogen atom, an alkyl group of 1 to 6 carbon atoms, —SH, —SCH$_2$CH$_2$CH$_2$SO$_3$Na, —NH$_2$, —NHCH$_3$, or —N(CH$_3$)$_2$; $R^{10}$ is an alkyl group of 1 to 6 carbon atoms, alkenyl, or carboxyalkyl; $R^{11}$ is an anion comprising a halogen atom or sulfate;

IV) a dialkyldithiocarbamic acid having formula:

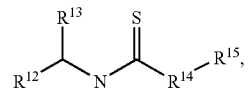

where $R^{12}$ and $R^{13}$ are independently a hydrogen atom, an alkyl group of 1 to 6 carbon atoms; $R^{14}$ is —S— or —SCH$_2$CH$_2$CH$_2$SO$_3$—; and $R^{15}$ is a hydrogen atom, ammonium, sodium, or potassium;

V) an o-alkylxanthic acid derivative having formula:

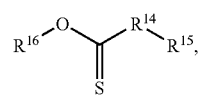

where $R^{14}$ and $R^{15}$ are as described above and $R^{16}$ is an alkyl group of 1 to 6 carbon atoms;

VI) a heterocyclic compound having formula:

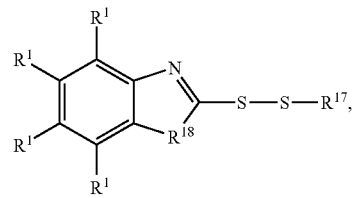

where $R^1$ is as described above; $R^{17}$ is an alkyl group of 1 to 30 carbon atoms; and $R^{18}$ is a carbon atom, an oxygen atom, or a sulfur atom;

VII) an amine salt derivative of a mercaptobenzothiazole having formula:

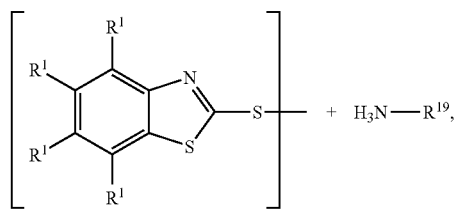

where $R^{19}$ is an alkyl or alkenyl group of 4 to 30 carbon atoms;

VIII) a 2,5-bis-hydrocarbyldithio-1,3,4-thiadiazole having formula:

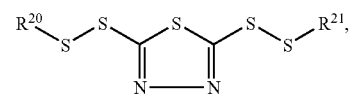

where $R^{20}$ and $R^{21}$ are each independently alkyl groups of 4 to 30 carbon atoms or alkenyl groups of 4 to 30 carbon atoms;

IX) a mercaptothiazol having formula:

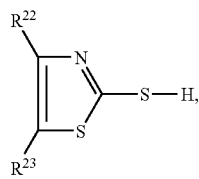

where $R^{22}$ and $R^{23}$ are each independently selected from a hydrogen atom and an alkyl group; and X) an imidazoline having formula:

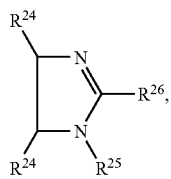

where each $R^{24}$ is independently a hydrogen atom or an alkyl group, $R^{25}$ is group having a molecular weight less than 75, and $R^{26}$ is a hydrocarbon group of 8 to 20 carbon atoms.

12. The plasma display panel of claim 9, where component B) comprises an alkoxysilane, an amino alkyl silane, an epoxy alkyl silane, a mercapto alkyl silane, or a combination thereof.

13. The plasma display panel of claim 9, where component C) is present and comprises a catalyst selected from a Lewis acid; a primary, secondary, or tertiary organic amine; a metal oxide; a titanium compound; a tin compound; a zirconium compound; or a combination thereof.

14. The plasma display panel of claim 8, where component A) is selected from:
I) an aliphatic or cycloaliphatic mono- or poly-carboxylic acid substituted in its aliphatic or cycloaliphatic group by at least one group of formula:

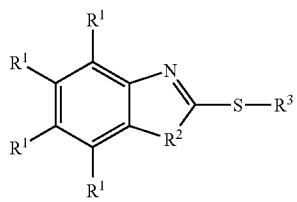

where $R^3$ is an aliphatic or cycloaliphatic mono- or poly-carboxylic acid containing compound, $R^2$ is a carbon atom, an oxygen atom, a sulfur atom, or NH and each $R^1$ is independently a hydrogen atom, alkyl group, halogenated alkyl group, alkoxy group, alkylthio group, alkylsulfonyl group, cycloalkyl group, phenyl group, alkylphenyl group, phenylalkyl group, halogen atom, —CN, —NO$_2$, —COOH, —COO-alkyl, —OH, primary amino, secondary amino, tertiary amino, or carbamoyl group;

II) a thiourea derivative having a formula selected from:

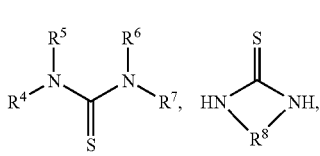

or combinations thereof, where each $R^4$, $R^5$, and $R^6$ are independently selected from a hydrogen atom, an alkyl group of 1 to 6 carbon atoms, acetyl, and alkenyl; $R^7$ is hydrogen, an alkyl group of 1 to 6 carbon atoms, acetyl, alkenyl, or —NH$_2$; and $R^8$ is a divalent hydrocarbon group of at least two carbon atoms;

III) a benzothiazole derivative having a formula selected from:

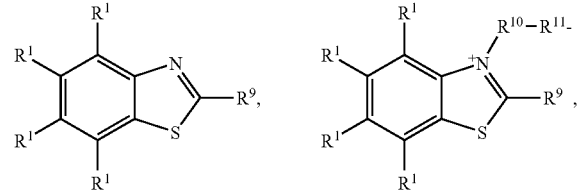

or a combination thereof, where $R^1$ is as described above; $R^9$ is a hydrogen atom, an alkyl group of 1 to 6 carbon atoms, —SH, —SCH$_2$CH$_2$CH$_2$SO$_3$Na, —NH$_2$, —NHCH$_3$, or —N(CH$_3$)$_2$; $R^{10}$ is an alkyl group of 1 to 6 carbon atoms, alkenyl, or carboxyalkyl; $R^{11}$ is an anion comprising a halogen atom or sulfate;

IV) a dialkyldithiocarbamic acid having formula:

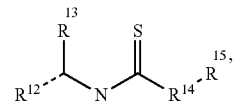

where $R^{12}$ and $R^{13}$ are independently a hydrogen atom, an alkyl group of 1 to 6 carbon atoms; $R^{14}$ is —S— or —SCH$_2$CH$_2$CH$_2$SO$_3$—; and $R^{15}$ is a hydrogen atom, ammonium, sodium, or potassium;

V) an o-alkylxanthic acid derivative having formula:

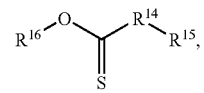

where $R^{14}$ and $R^{15}$ are as described above and $R^{16}$ is an alkyl group of 1 to 6 carbon atoms;

VI) a heterocyclic compound having formula:

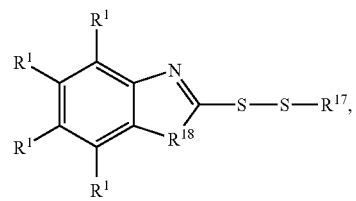

where $R^1$ is as described above; $R^{17}$ is an alkyl group of 1 to 30 carbon atoms; and $R^{18}$ is a carbon atom, an oxygen atom, or a sulfur atom;

VII) an amine salt derivative of a mercaptobenzothiazole having formula:

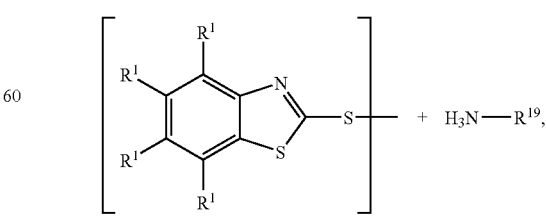

where $R^{19}$ is an alkyl or alkenyl group of 4 to 30 carbon atoms;

VIII) a 2,5-bis-hydrocarbyldithio-1,3,4-thiadiazole having formula:

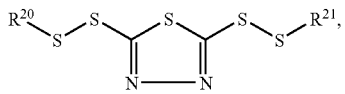

where $R^{20}$ and $R^{21}$ are each independently alkyl groups of 4 to 30 carbon atoms or alkenyl groups of 4 to 30 carbon atoms;

IX) a mercaptothiazol having formula:

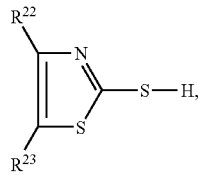

where $R^{22}$ and $R^{23}$ are each independently selected from a hydrogen atom and an alkyl group; and X) an imidazoline having formula:

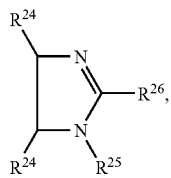

where each $R^{24}$ is independently a hydrogen atom or an alkyl group, $R^{25}$ is group having a molecular weight less than 75, and $R^{26}$ is a hydrocarbon group of 8 to 20 carbon atoms.

15. The plasma display panel of claim 8, where component C) is present and comprises a catalyst selected from a Lewis acid; a primary, secondary, or tertiary organic amine; a metal oxide; a titanium compound; a tin compound; a zirconium compound; or a combination thereof.

16. The process of claim 1, where component A) is selected from acridine, 2-amino-thiazole, 2-amino-thiazoline, 2-amino-1,2-4 triazole, anionine, benzimidazole, (2-benzimidazolylthio)succinic acid, benzoxazole (and derivatives thereof), benzothiazole (and derivatives thereof), benzimidazole (and derivatives thereof), benzotriazole, 3-benzylamino-1-butyne, decamethylene imide, diaminoheptane, dicyandiamine, N,N-di-(2-ethylhexyl)-4-methyl-1H-benzotriazole-1-methanamine, 2,5-dimercapto-1,3,4 thiadiazole, dipropargyl ether, dipropargyl thioether, 6-N-ethyl purine, 1-ethylamino-2-quinoline (and derivatives thereof), hexamethylene-3,5-dinitrobenzene, hexamethylene imide, hexamethylene iminebenzoate, hexamethylene tetramine, imidazole (and derivatives thereof), 3-isopropylamino-1-butyne, mercaptan, mercaptobenzothiazole, 2-mercaptothiazoline, d-oximino-b-vinyl quincuclidine, 1,10-phenathiodine, phenanthroline, phenothiazine, propargyl quinolinium bromide, propargyl caproate, (2-thio-2'-benzo-thiazolyl)butanedioic acid, thiophenol (and derivatives thereof), toluidine, or a combination thereof.

17. The process of claim 1, where component A) is selected from:

I) an aliphatic or cycloaliphatic mono- or poly-carboxylic acid substituted in its aliphatic or cycloaliphatic group by at least one group of formula:

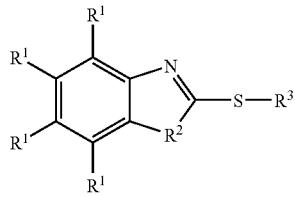

where $R^3$ is an aliphatic or cycloaliphatic mono- or poly-carboxylic acid containing compound, $R^2$ is a carbon atom, an oxygen atom, a sulfur atom, or NH and each $R^1$ is independently a hydrogen atom, alkyl group, halogenated alkyl group, alkoxy group, alkylthio group, alkylsulfonyl group, cycloalkyl group, phenyl group, alkylphenyl group, phenylalkyl group, halogen atom, —CN, —NO$_2$, —COOH, —COO-alkyl, —OH, primary amino, secondary amino, tertiary amino, or carbamoyl group;

II) a thiourea derivative having a formula selected from:

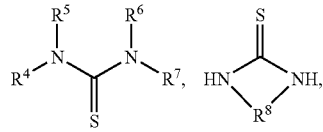

or combinations thereof, where each $R^4$, $R^5$, and $R^6$ are independently selected from a hydrogen atom, an alkyl group of 1 to 6 carbon atoms, acetyl, and alkenyl; $R^7$ is hydrogen, an alkyl group of 1 to 6 carbon atoms, acetyl, alkenyl, or —NH$_2$; and $R^8$ is a divalent hydrocarbon group of at least two carbon atoms;

III) a benzothiazole derivative having a formula selected from:

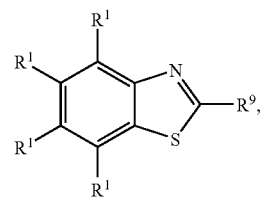 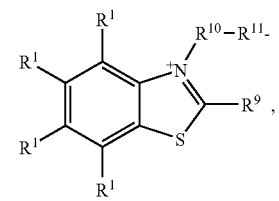

or a combination thereof, where $R^1$ is as described above; $R^9$ is a hydrogen atom, an alkyl group of 1 to 6 carbon atoms, —SH, —SCH$_2$CH$_2$CH$_2$SO$_3$Na, —NH$_2$, —NHCH$_3$, or —N(CH$_3$)$_2$; $R^{10}$ is an alkyl group of 1 to 6 carbon atoms, alkenyl, or carboxyalkyl; $R^{11}$ is an anion comprising a halogen atom or sulfate;

IV) a dialkyldithiocarbamic acid having formula:

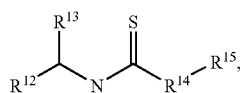

where $R^{12}$ and $R^{13}$ are independently a hydrogen atom, an alkyl group of 1 to 6 carbon atoms; $R^{14}$ is —S— or —SCH$_2$CH$_2$SO$_3$—; and $R^{15}$ is a hydrogen atom, ammonium, sodium, or potassium;

V) an o-alkylxanthic acid derivative having formula:

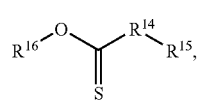

where $R^{14}$ and $R^{15}$ are as described above and $R^{16}$ is an alkyl group of 1 to 6 carbon atoms;

VI) a heterocyclic compound having formula:

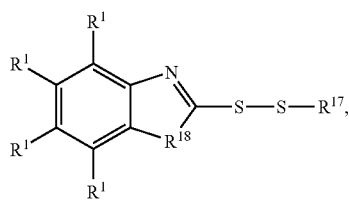

where $R^1$ is as described above; $R^{17}$ is an alkyl group of 1 to 30 carbon atoms; and $R^{18}$ is a carbon atom, an oxygen atom, or a sulfur atom;

VII) an amine salt derivative of a mercaptobenzothiazole having formula:

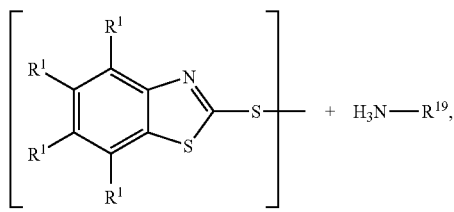

where $R^{19}$ is an alkyl or alkenyl group of 4 to 30 carbon atoms;

VIII) a 2,5-bis-hydrocarbyldithio-1,3,4-thiadiazole having formula:

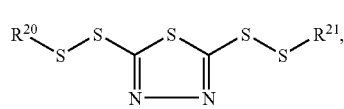

where $R^{20}$ and $R^{21}$ are each independently alkyl groups of 4 to 30 carbon atoms or alkenyl groups of 4 to 30 carbon atoms;

IX) a mercaptothiazol having formula:

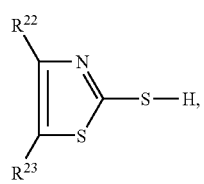

where $R^{22}$ and $R^{23}$ are each independently selected from a hydrogen atom and an alkyl group; and X) an imidazoline having formula:

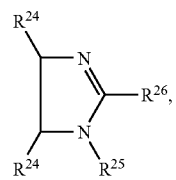

where each $R^{24}$ is independently a hydrogen atom or an alkyl group, $R^{25}$ is group having a molecular weight less than 75, and $R^{26}$ is a hydrocarbon group of 8 to 20 carbon atoms.

18. The process of claim 1, where component B) comprises an alkoxysilane, an amino alkyl silane, an epoxy alkyl silane, a mercapto alkyl silane, or a combination thereof.

19. The process of claim 1, where component C) is present and comprises a catalyst selected from a Lewis acid; a primary, secondary, or tertiary organic amine; a metal oxide; a titanium compound; a tin compound; a zirconium compound; or a combination thereof.

* * * * *